United States Patent [19]
Kohn

[11] Patent Number: 4,494,132
[45] Date of Patent: Jan. 15, 1985

[54] SEMICONDUCTOR OPTO-ELECTRONIC SWITCH

[75] Inventor: Erhard Kohn, Leingarten, Fed. Rep. of Germany

[73] Assignee: Telefunken Electronic GmbH, Heilbronn, Fed. Rep. of Germany

[21] Appl. No.: 340,733

[22] Filed: Jan. 19, 1982

[30] Foreign Application Priority Data

Feb. 12, 1981 [DE] Fed. Rep. of Germany ....... 3105050

[51] Int. Cl.$^3$ ............... H01L 27/12; H01L 29/06; H01L 29/04; H01L 27/14
[52] U.S. Cl. ............................... 357/30; 357/4; 357/55; 357/58; 250/211 J
[58] Field of Search ............... 357/30, 30 D, 55, 4, 357/58; 250/211 J

[56] References Cited

U.S. PATENT DOCUMENTS

| | | | |
|---|---|---|---|
| 3,700,980 | 10/1972 | Belasco et al. | 357/30 |
| 4,194,935 | 3/1980 | Dingle et al. | 357/16 |
| 4,281,208 | 7/1981 | Kuwano et al. | 357/30 |
| 4,347,526 | 8/1982 | Elliott | 357/30 |
| 4,376,285 | 3/1983 | Leonberger et al. | 357/30 X |
| 4,396,833 | 8/1983 | Pan | 357/30 |

*Primary Examiner*—Andrew J. James
*Assistant Examiner*—J. Carroll
*Attorney, Agent, or Firm*—Spencer & Frank

[57] ABSTRACT

An opto-electronic switch component which comprises two regions of good conductivity separated by a gap on a normally non-conductive substrate. When the gap is irradiated, the conductivity of the substrate increases and a connection is formed between the two regions.

11 Claims, 4 Drawing Figures

SEMICONDUCTOR OPTO-ELECTRONIC SWITCH

BACKGROUND OF THE INVENTION

The invention relates to a new type of component which allows a flow of current between electrodes which are arranged on a current channel when acted upon by radiation, more particularly light. The new component may be used as a light detector for example.

SUMMARY OF THE INVENTION

According to the invention there is provided an electronic component having first, second and third semiconductor regions, said second and third regions having a higher conductivity than said first region and touching said first region and said second and third regions being separated from each other by a gap, and two electrodes, a respective one of each of said electrodes being in contact with each of said second and third regions, said first region being sensitive to irradiation so that when said first region is irradiated, the conductivity of said first region increases to form a conductive connection between said second and third regions.

Further according to the invention there is provided a component having first, second and third semiconductor regions, said second and third regions bordering on said first region, having a larger conductivity than said first region and being separated from each other by a gap, and two electrodes, a respective one of said electrodes being arranged on each of said second and third regions, whereby a voltage for producing a current flow between said two electrodes can be applied to said electrodes, said second and third regions being arranged as current channels; and said first region being arranged so that, when said first region is irradiated, a current channel is formed in said first region as a conductive connection between said second and third regions in order to bridge said gap.

BRIEF DESCRIPTION OF THE DRAWINGS

Preferred embodiments of the invention will now be described in greater detail by way of example, in the figures.

DESCRIPTION OF THE PREFERRED EMBODIMENTS

Basically a component in accordance with the invention consists of a first region, having a second and a third region bordering thereron, with the second and third regions being separated from each other by means of a gap and having a larger conductivity than the first region, electrodes being arranged on the second and third regions, so that a voltage for producing a current flow between the two electrodes can be applied to these electrodes; the second and third regions are formed as current channels and the first rion with a logic circuit and is particularly suitable for GBit/sec Data processing. In the component in accordance with the invention there is an optical switch with a high product of band width amplification.

The invention also has the advantage that a plurality of switches constituted by components in accordance with the invention can be joined together monolithically (or in hybrid manner) into a logic function arrangement and can be coupled monolithically direct to a logic unit which is carrying out processing. As a result it is possible to convert and process optical signals in the GBit/sec range.

In accordance with a preferred embodiment of the invention the component has a semiconductor substrate and a semiconductor layer located on the substrate and subdivided into two regions by a gap, furrow or groove. The two regions on the substrate have the same or the opposite type of conductivity as that of the substrate. The substrate may also be semi-insulating. The substrate preferably comprises a photo-conductive material.

Figure 1:
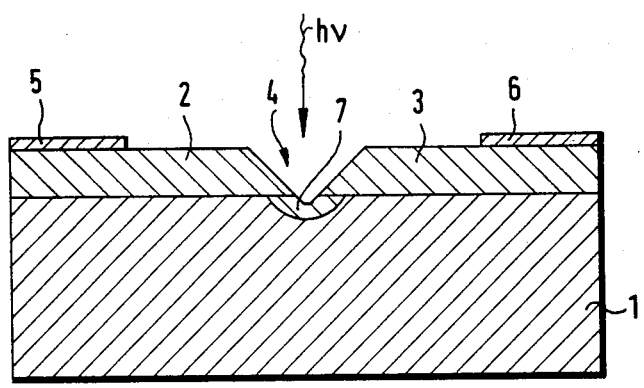
FIG. 1 shows a sectional view of a component in accordance with a first embodiment of the invention.

Referring now to the drawings, the component of FIG. 1 comprises a substrate 1 of semiconductor material (first region) and two semiconductor regions 2 and 3 (second and third regions) which are located on the substrate 1, form a current channel, and are separated from each other by means of a groove 4 which in the embodiment shown is a V-shaped groove. An ohmic electrode 5 is located on the region 2 and an ohmic electrode 6 is located on the region 3. The regions 2 and 3 have n-type conductivity whereas the substrate 1 comprises highly resistant p- or n-conductive semiconductor material or semi-insulating material.

If a voltage is applied to the electrodes 5 and 6 then current can only flow between the electrodes 5 and 6 via the substrate 1 because of groove 4. The substrate 1 is so highly resistant, however, that in the non-irradiated condition, i.e., when no light or radiation falls on to the substrate (in the groove region), no current is able to flow from the region 2 to the region 3 via the substrate 1. Current flow only occurs in fact, if light radiation falls on to the substrate region 7 so that a photo-conductive area is produced in the region 7 by forming pairs of electron holes.

The component according to the invention has a N/N⁻ layer sequence by way of example. This means that the substrate 1 comprises n-semiconductor material and the regions 2 and 3 comprise low resistance n-semiconductor material which is a good conductor. In such a component, the current flow may be produced via the substrate in the region 7 by means of photo-conductivity if the substrate material has appropriateow through the N⁻ substrate.

The component in accordance with the invention may also have an N/P⁻ or N/SI layer sequence however in accordance with a modification. In this case, the regions 2 and 3 again comprise a good semiconductor material of the N-conduction type whereas the substrate 1 comprises a weakly conductive P-semiconductor material or semi-insulating (SI) material. In such a component a dark current with a limited space charge is suppressed by means of the P⁻ or SI substrate by the N/P⁻ barrier or by a boundary area density in the region of the N/SI junction up to a critical voltage $V_c$.

With a component with N/P⁻ or N/SI layer sequence, if the groove 4 is illuminated then charge carriers are produced in the space charge region of the substrate 1 and a current is able to flow.

The groove 4 between the regions 2 and 3 can be produced for example by means of isotropic etching. Separation of the regions 2 and 3 can be controlled very accurately electrically so that a current channel length L of approximately 0.1 μm can be assumed. Other suitabe semiconductor materials for the substrate are semiconductors with a high band spacing or hetero-structures such as SOS or GaAlAs on GaAs.

In view of the small separating gaps there is a high field strength even at a low operating voltage $V_{DS}$ (only a few volts) so that the arrangement has a high product of band width amplification.

Figure 2:
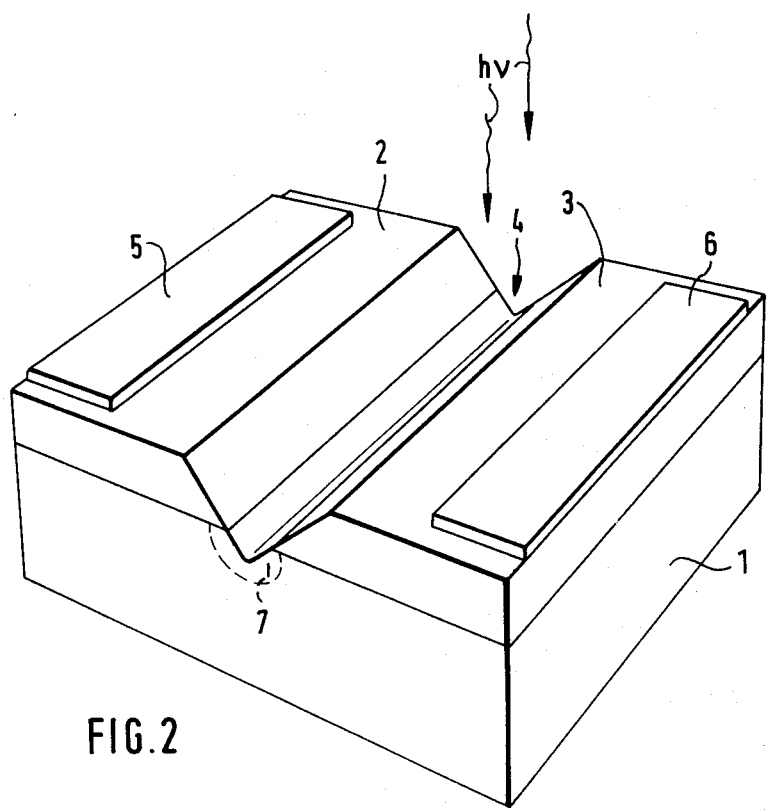
FIG. 2 shows a perspective view of the embodiment of FIG. 1.
Figure 3:
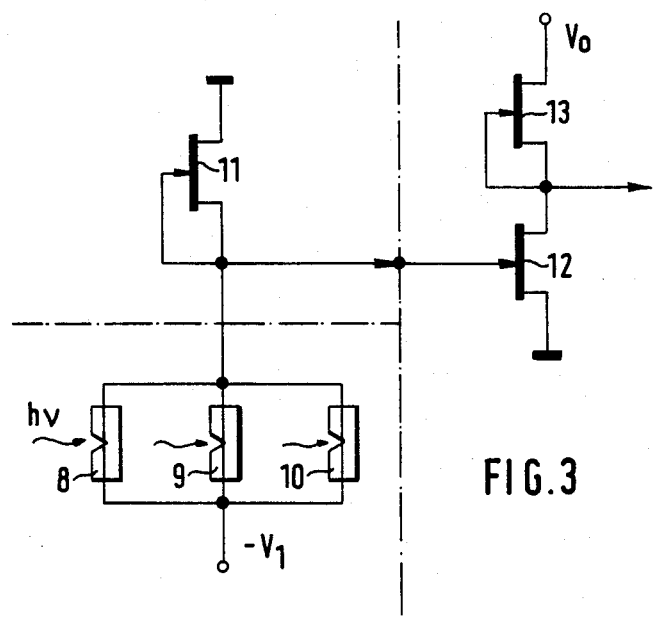
FIG. 3 shows a schematic view of a second embodiment of the invention.

FIG. 3 shows a schematic view of circuitry incorporating a component in accordance with a second embodiment of the invention in which detectors 8, 9 and 10 (which are similar to the component shown in FIGS. 1 and 2) are monolithically integrated together with a control logic element (FET 11) and a processing logic unit (FET's 12 and 13). The three detectors 8, 9 and 10 are connected in parallel. The transistor 11 of the control logic unit is in series with this parallel circuit. The voltage $V_1$ is applied to this series circuit. The processing logic unit comprises the series circuit of the transistors 12 and 13. The voltage $V_o$ is applied to this series circuit.

Figure 4:
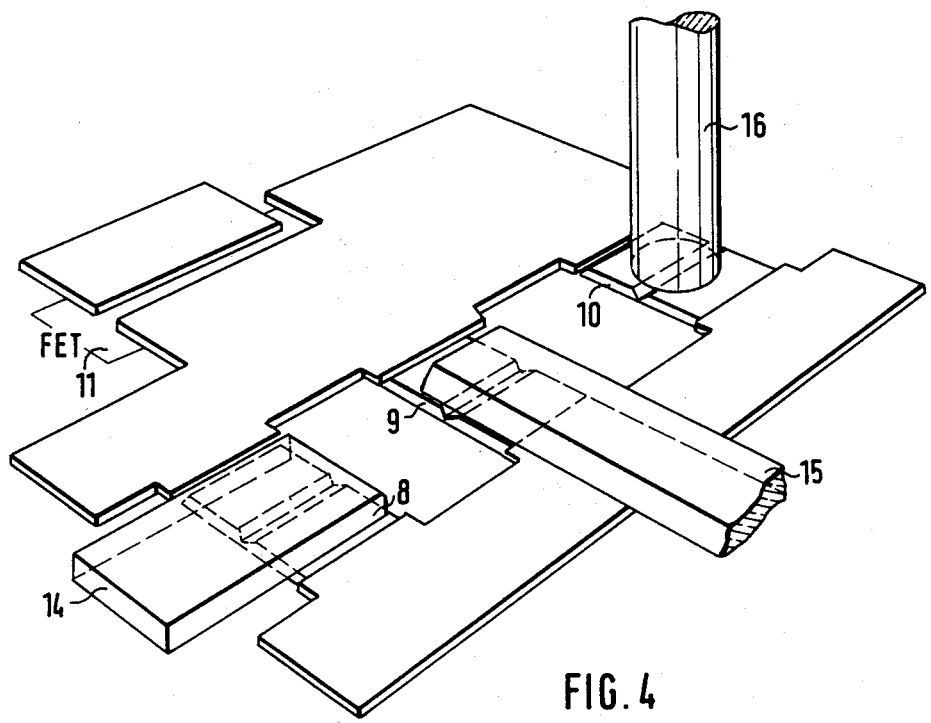
FIG. 4 shows a perspective view of an arrangement exemplifying the embodiment of FIG. 3.

FIG. 4 shows an integrated detector circuit which may be used in the circuitry of FIG. 3. Detectors 8, 9 and 10 and processing GBit logic unit 11, (12, 13 not shown) are monolithically integrated (e.g. on GaAs) in this circuit; and light conductors 14, 15, 16 and are guided over the detectors in the form of fibers (16) or planar optical conductors (14, 15). The planar optical conductors can be coupled to fibers at remote locations. When planar optical conductors are used, a detector array of very small dimensions can be used.

It will be understood that the above description of the present invention is susceptible to various modifications, changes and adaptations.

I claim:

1. An opto-electronic component comprising: a semiconductor substrate; a semiconductor layer having a higher conductivity then said substrate directly disposed on a surface of said substrate; a V-shaped groove extending from the surface of said semiconductor layer through said semiconductor layer at least to said surface of said substrate and subdividing said semiconductor layer into two separate semiconductor regions; a respective ohmic contact electrode disposed on the outer surface of each of said two semiconductor regions; and said substrate is sensitive to irradiation of the portion of its said surface exposed by said groove to produce a conductive connection within said substrate and between said two semiconductor regions, whereby upon such irradiation current can flow between said contact electrodes when a voltage is applied across said contact electrodes.

2. A component as defined in claim 10 wherein said substrate has a relatively low conductivity.

3. A component as defined in claim 2, wherein said substrate is of one conductivity type and said two semiconductor regions on said substrate have the same type of conductivity as said substrate.

4. A component as defined in claim 2, wherein said substrate is semi-insulating.

5. A component as defined in claim 2, wherein said substrate comprises a photoconductive semiconductor material.

6. A component as defined in claim 5, wherein said substrate comprises a compound semiconductor material.

7. A component as defined in claim 6, wherein said substrate comprises GaAs.

8. A opto-electronic component as defined in claim 1 wherein the point of said V-shaped groove extends into said substrate.

9. A component as defined in claim 2 wherein said substrate is of one conductivity type and said two semiconductor regions on said substrate are of the opposite conductivity type.

10. A component as defined in claim 2 wherein said substrate is sensitive to irradiation to increase its conductivity to form said conductive connection.

11. A component as defined in claim 2 wherein said semiconductor layer is formed of low resistance semiconductor material.

* * * * *